(12) United States Patent
Nishida

(10) Patent No.: US 11,059,137 B2
(45) Date of Patent: Jul. 13, 2021

(54) TOOL SET FOR USE IN POSITION ADJUSTMENT OF POSITIONING PINS

(71) Applicant: EBARA CORPORATION, Tokyo (JP)

(72) Inventor: Hiroaki Nishida, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 389 days.

(21) Appl. No.: 16/266,495

(22) Filed: Feb. 4, 2019

(65) Prior Publication Data
US 2019/0240794 A1 Aug. 8, 2019

(30) Foreign Application Priority Data
Feb. 6, 2018 (JP) .............................. JP2018-019032

(51) Int. Cl.
| | |
|---|---|
| *H01L 21/68* | (2006.01) |
| *B23Q 3/18* | (2006.01) |
| *H01L 21/67* | (2006.01) |
| *G03F 7/20* | (2006.01) |
| *H01L 21/687* | (2006.01) |
| *G01B 5/25* | (2006.01) |

(52) U.S. Cl.
CPC ............. *B23Q 3/186* (2013.01); *G01B 5/25* (2013.01); *G03F 7/70716* (2013.01); *H01L 21/67259* (2013.01); *H01L 21/68* (2013.01); *H01L 21/68728* (2013.01)

(58) Field of Classification Search
CPC .............. B23Q 3/186; H01L 21/68728; H01L 21/67259; H01L 21/68; G03F 7/70716
USPC .......................................................... 33/645
See application file for complete search history.

(56) References Cited

U.S. PATENT DOCUMENTS

| | | | | |
|---|---|---|---|---|
| 5,035,062 A | * | 7/1991 | Leonov .................. | H01L 21/68 33/533 |
| 6,032,512 A | * | 3/2000 | Li ........................... | H01L 21/68 73/1.79 |
| 6,374,508 B1 | * | 4/2002 | Yudovsky ........... | C23C 16/4583 269/53 |
| 6,463,782 B1 | * | 10/2002 | Shen ...................... | B25J 9/1692 73/1.79 |
| 6,530,157 B1 | * | 3/2003 | Henderson ............. | H01L 21/68 33/520 |
| 9,146,090 B2 | * | 9/2015 | Grimes ................... | G01B 5/25 |
| 2003/0051364 A1 | * | 3/2003 | Donoso .................. | H01L 21/68 33/645 |

(Continued)

FOREIGN PATENT DOCUMENTS

JP    H10-073636 A    3/1998

*Primary Examiner* — Yaritza Guadalupe-McCall
(74) *Attorney, Agent, or Firm* — BakerHostetler

(57) ABSTRACT

A tool set that can easily check positions of positioning pins for a workpiece even in an environment using a liquid is disclosed. The tool set includes: a reference tool to be placed on the holding stage; a dummy workpiece to be placed on the reference tool; and a check pin having a cylindrical circumferential surface. The reference tool has a central protrusion having a cylindrical circumferential surface. The dummy workpiece has a circular through-hole having a diameter larger than a diameter of the circumferential surface of the central protrusion. A diameter of the check pin is smaller than a value determined by dividing a difference between the diameter of the circular through-hole and the diameter of the circumferential surface of the central protrusion by 2.

5 Claims, 17 Drawing Sheets

(56) References Cited

U.S. PATENT DOCUMENTS

2019/0240794 A1\* 8/2019 Nishida .................. H01L 21/68

\* cited by examiner

TOOL SET FOR USE IN POSITION ADJUSTMENT OF POSITIONING PINS

CROSS REFERENCE TO RELATED APPLICATION

This document claims priority to Japanese Patent Application Number 2018-019032 filed Feb. 6, 2018, the entire contents of which are hereby incorporated by reference.

BACKGROUND

When a workpiece, such as a wafer, is to be processed, the workpiece is held on a holding stage. In order to precisely process a desired position of the workpiece, it is necessary to place the workpiece in a predetermined position on the holding stage. Thus, in order to align the center of the workpiece with the center of the holding stage, at least three positioning pins arranged around the holding stage are used to center the workpiece. Specifically, the plurality of positioning pins move evenly toward the center of the holding stage, thereby moving the workpiece to a predetermined position.

If the positioning pins are not installed at correct positions, the center of the workpiece will deviate from the center of the holding stage when the positioning pin presses the workpiece. Therefore, it is necessary to check whether the positioning pins are installed at the correct positions.

Japanese Laid-open Patent Publication No. 10-73636 discloses a technique for inspecting whether or not an object is in a correct position. Specifically, a camera generates an image of holes forming in both the object and a reference member, and positional deviation between the object and the reference member is detected from the positions of the holes appearing on the image. However, this system requires the camera and an image analyzing device, both of which are expensive. Furthermore, if a liquid adheres to the object or a lens of the camera, the position or shape of the object may not be accurately detected due to the influence of refraction of light. For this reason, the system disclosed in Japanese Laid-open Patent Publication No. 10-73636 cannot be incorporated to a processing apparatus using liquid.

SUMMARY OF THE INVENTION

According to an embodiment, there is provided a tool set that can easily check positions of positioning pins for a workpiece even in an environment in which a liquid is used. Further, according to an embodiment, there is provided a method of checking the positions of the positioning pins with use of such a tool set.

Embodiments, which will be described below, relate to a tool set for use in adjusting positions of positioning pins arranged around a holding stage for holding a workpiece such as a wafer.

In an embodiment, there is provided a tool set for use in adjusting positions of positioning pins arranged around a holding stage for holding a workpiece, comprising: a reference tool to be placed on the holding stage; a dummy workpiece to be placed on the reference tool; and a check pin having a cylindrical circumferential surface, wherein the reference tool has a central protrusion having a cylindrical circumferential surface, the dummy workpiece has a circular through-hole having a diameter larger than a diameter of the circumferential surface of the central protrusion, an outer edge of the dummy workpiece and the through-hole are concentric, and a diameter of the check pin is smaller than a value determined by dividing a difference between the diameter of the circular through-hole and the diameter of the circumferential surface of the central protrusion by 2.

In an embodiment, the outer edge of the dummy workpiece has the same thickness as the workpiece.

In an embodiment, the tool set further comprises a pair of positioning tools configured to cause a center of the central protrusion to coincide with a reference point of the holding stage.

In an embodiment, the reference tool further includes a cylinder protruding from the center of the central protrusion, each of the positioning tools comprises an elongated hole and two hooks, the elongated hole having the same width as a diameter of the cylinder, the two hooks having inner surfaces facing the elongated hole, and the two hooks are symmetric with respect to a center line passing through a center of the elongated hole and extending in a longitudinal direction of the elongated hole.

In an embodiment, there is provided a method of checking positions of positioning pins arranged around a holding stage with use of the tool set described above, the method comprising: holding the reference tool on the holding stage, with a center of the reference tool coinciding with a reference point of the holding stage; placing the dummy workpiece on the reference tool such that the central protrusion of the reference tool is located in the through-hole of the dummy workpiece; pushing an outer edge of the dummy workpiece inwardly by the positioning pins; and inserting the check pin into an annular groove formed between the circumferential surface of the central protrusion and the through-hole.

When the positioning pins are installed at correct positions, an annular groove formed between the through-hole of the dummy workpiece, pushed by the positioning pins, and the central protrusion of the reference tool has an equal width over an entire circumference of the annular groove. Therefore, when the check pin can be inserted into the annular groove at all positions thereof, it can be judged that the center of the dummy workpiece is within a predetermined positioning accuracy with respect to the center of the central protrusion. If, on the other hand, the check pin cannot be inserted into the annular groove at a certain point, it can be determined that the center of the dummy workpiece is out of the predetermined positioning accuracy with respect to the central protrusion, i.e., at least one of the positioning pins is not installed at a correct position. In this manner, according to the above-described embodiments, it is possible to check whether or not the positioning pins are installed at the correct positions by using the simple tool set.

DESCRIPTION OF THE EMBODIMENTS

Hereinafter, embodiments will be described with reference to the drawings.

Figure 1:
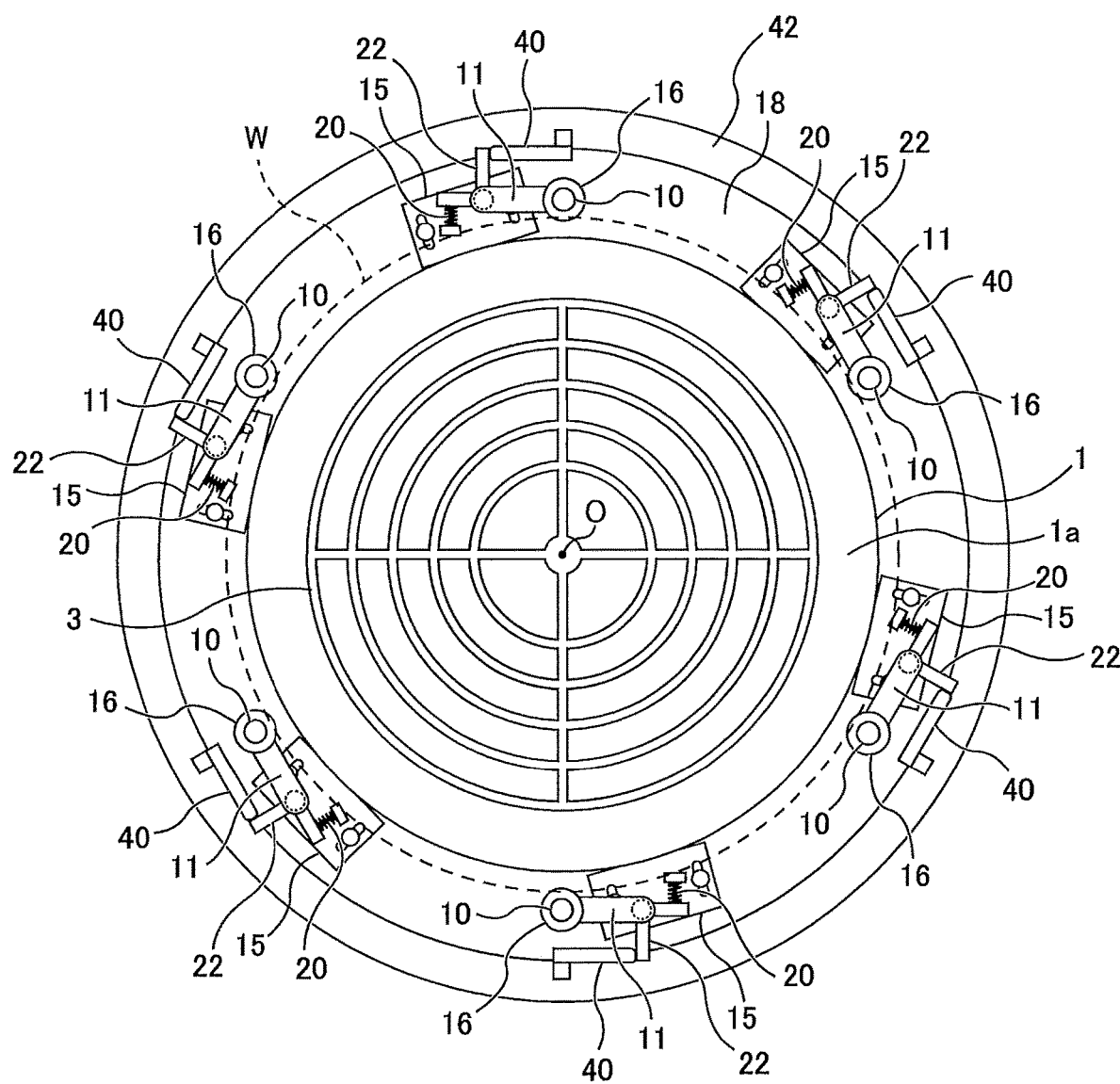
FIG. 1 is a plan view showing a holding stage for holding a wafer which is an example of a workpiece.

FIG. 1 is a plan view showing a holding stage for holding a wafer as an example of a workpiece. A holding stage 1 of the present embodiment is a stage for holding a circular wafer W as a workpiece. The holding stage 1 has a stage surface 1a, and the wafer W is placed on the stage surface 1a. The size of the stage surface 1a is not particularly limited and may be smaller than the wafer W or may be the same as the wafer W. The holding stage 1 may have recesses in its outer peripheral portion so as not to restrict movement of positioning pins, which will be described later. A vacuum suction groove 3 is formed in the stage surface 1a. This vacuum suction groove 3 is coupled to a vacuum line (not shown in the drawings). When a vacuum is formed in the vacuum suction groove 3 with the wafer W placed on the stage surface 1a, the wafer W is held on the stage surface 1a by the vacuum. Instead of the vacuum suction grooves 3, a plurality of vacuum suction holes may be provided.

A plurality of positioning pins 10 are arranged around the holding stage 1. The positioning pins 10 are configured to move in synchronization with each other toward a reference point O of the holding stage 1, thereby pushing an outermost edge of the wafer W toward the reference point O of the holding stage 1, so that the center of the wafer W substantially coincides with the reference point O of the holding stage 1. In this specification, the state in which the center of the wafer W substantially coincides with the reference point O of the holding stage 1 means that the center of the wafer W is within a predetermined positioning accuracy with respect to the reference point O of the holding stage 1. The reference point O is a predefined imaginary point. In the present embodiment, the reference point O is the center point of the holding stage 1. Therefore, when the positioning pins 10 push the wafer W inwardly, the center of the wafer W substantially coincides with the center of the holding stage 1 (i.e., the centering of the wafer W is achieved). In the present embodiment, six positioning pins 10 are disposed, while the present invention is not limited to this embodiment. In order to achieve the centering of the wafer W, at least three positioning pins are disposed.

The positioning pins 10 are fixed to cranks 11, respectively. The cranks 11 are rotatably supported by pedestals 15, respectively. The cranks 11 have workpiece supporting portions 16 coupled to lower portions of the positioning pins 10. Each workpiece supporting portion 16 protrudes outwardly from the circumferential surface of each positioning pin 10. The pedestals 15 are fixed to an annular rotary stage 18. The rotary stage 18 is arranged so as to surround the holding stage 1, and is configured to be rotatable together with the holding stage 1. Therefore, the cranks 11 and the positioning pins 10 can rotate together with the holding stage 1 and the rotary stage 18. Torques are applied to the cranks 11 by springs 20, respectively, which are biasing members. More specifically, each spring 20 applies a force to the crank 11 to rotate the positioning pin 10 in a direction to move toward the reference point O of the holding stage 1. The springs 20 are held by the pedestals 15, respectively.

A plurality of stoppers 40 are arranged outside the plurality of positioning pins 10 and the plurality of cranks 11. The stoppers 40 are fixed to a stopper base 42 disposed outside the rotary stage 18. Unlike the rotary stage 18, the stopper base 42 does not rotate. Stopper contact portions 22 projecting outwardly are fixed to the cranks 11, respectively. The holding stage 1 and the rotary stage 18 are coupled to a rotating mechanism (not shown in the drawings). When the rotating mechanism rotates the holding stage 1 and the rotary stage 18 in the clockwise direction, the cranks 11, the positioning pins 10, and the pedestals 15 rotate in the same direction, until the stopper contact portions 22 are brought into contact with the stoppers 40, as shown in FIG. 1. At this time, the stoppers 40 rotate the cranks 11 in a direction in which the positioning pins 10 move away from the reference point O of the holding stage 1.

The rotary stage 18 and the stopper base 42 are coupled to a vertically-moving mechanism (not shown in the drawings). The rotary stage 18, the cranks 11, the workpiece support portions 16, the positioning pins 10, the stopper base 42, and the stoppers 40 are moved up and down together by the vertically-moving mechanism. Before the wafer W is transferred to the holding stage 1, the rotary stage 18, the cranks 11, the workpiece supporting portions 16, the positioning pins 10, the stopper base 42, and the stoppers 40 are raised by the vertically-moving mechanism. When the workpiece supporting portions 16 and the positioning pins 10 are in their positions shown in FIG. 1, the peripheral edge of the wafer W is placed on the workpiece supporting portions 16. While the wafer W is supported by the workpiece supporting portions 16, the positioning pins 10 and the workpiece supporting portions 16 are lowered together with the wafer W by the vertically-moving mechanism, so that the wafer W is placed on the stage surface 1a of the holding stage 1.

Figure 2:
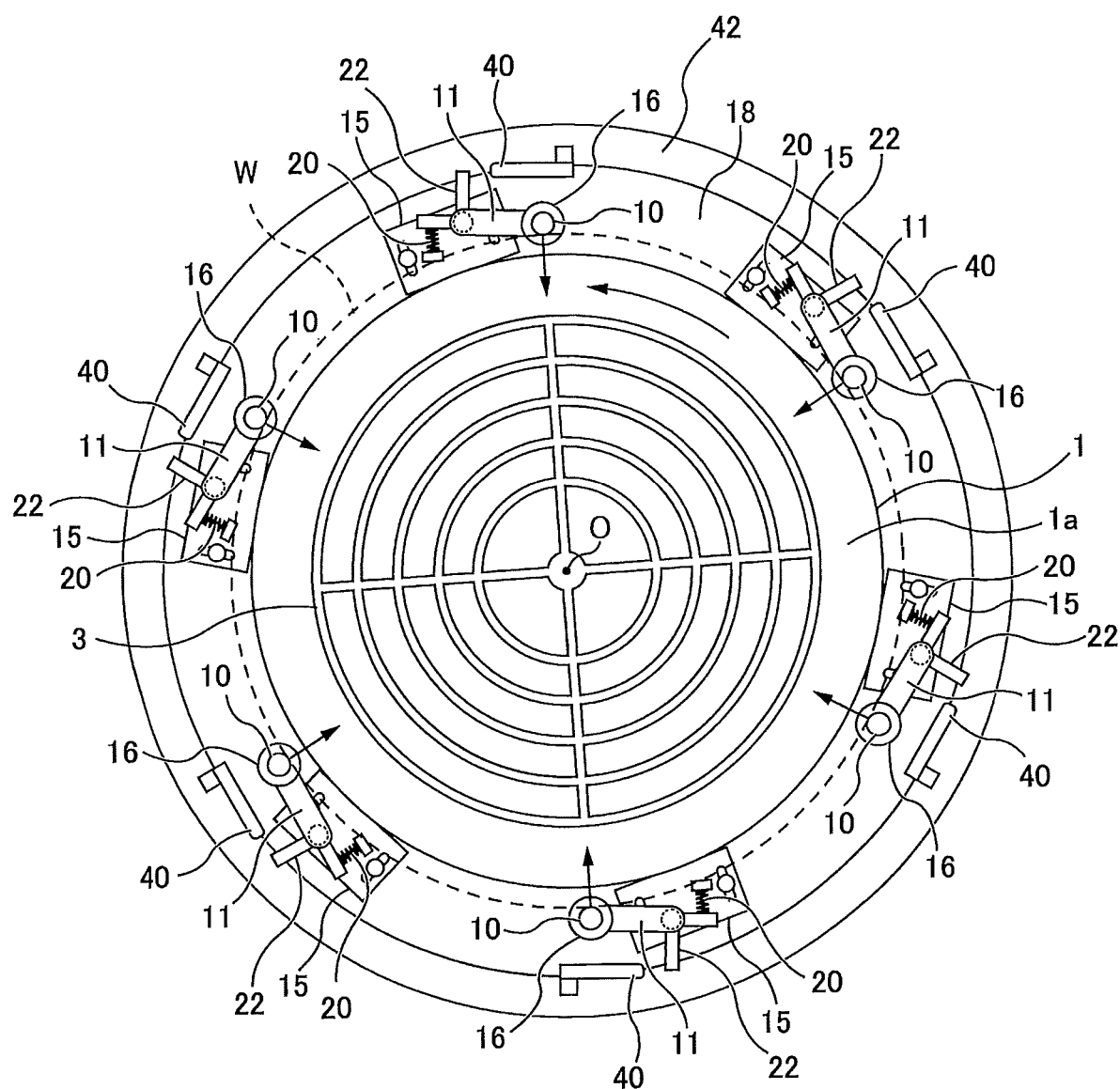
FIG. 2 is a plan view showing a state in which positioning pins push an outermost edge of the wafer inwardly.

Subsequently, as shown in FIG. 2, the holding stage 1 and the rotary stage 18 are slightly rotated counterclockwise. At this time, the cranks 11, the positioning pins 10, and the pedestals 15 rotate in the same direction, until the stopper contact portions 22 separates from the stoppers 40. At the same time, the springs 20 rotate the cranks 11 clockwise to move the positioning pins 10 toward the reference point O of the holding stage 1. The positioning pins 10 push the outermost edge of the wafer W inwardly so that the center of the wafer W substantially coincides with the reference point O of the holding stage 1. In the present embodiment, since the reference point O corresponds to the center point of the holding stage 1, the wafer W is centered by the positioning pins 10.

Figure 3:
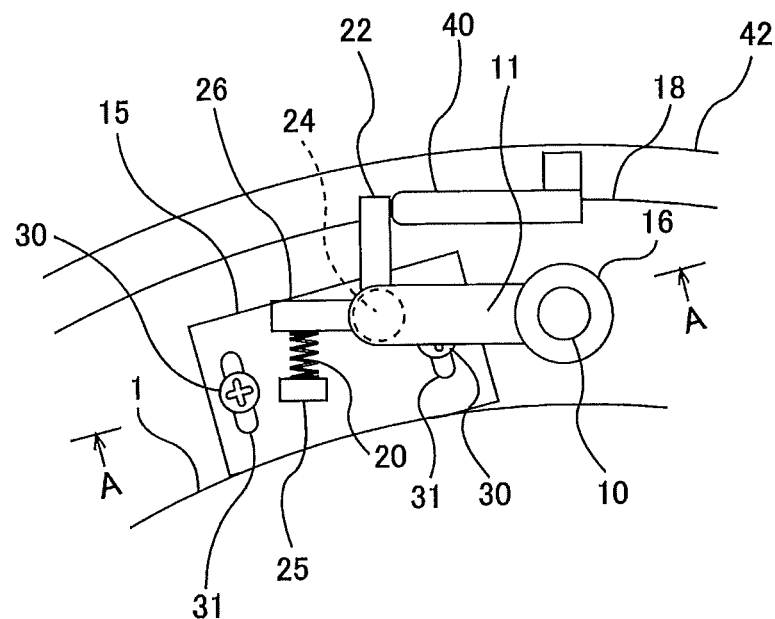
FIG. 3 is an enlarged view of a positioning pin, a crank, and a pedestal.
Figure 4:
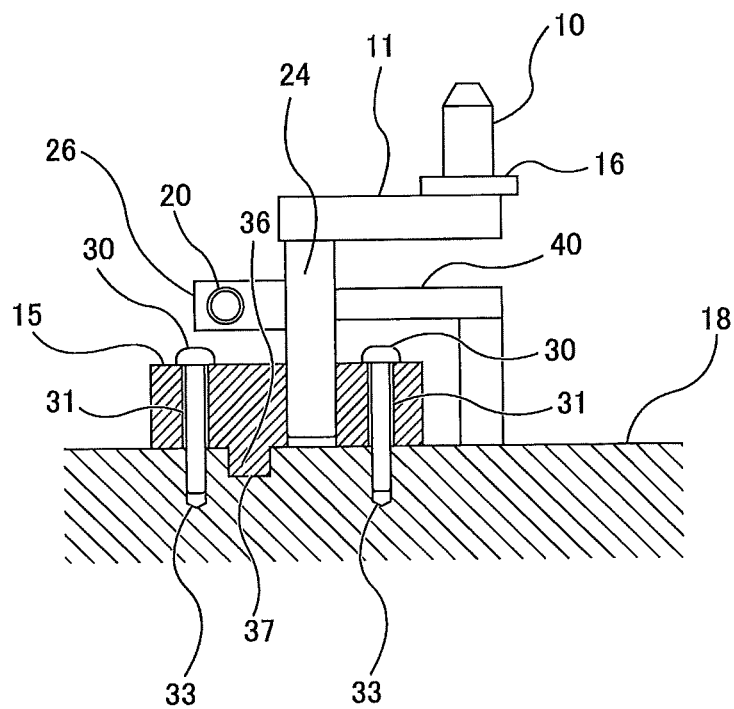
FIG. 4 is a cross-sectional view taken along line A-A of FIG. 3.

FIG. 3 is an enlarged view showing the positioning pin 10, the crank 11, and the pedestal 15, and FIG. 4 is a sectional view taken along line A-A of FIG. 3. The crank 11 includes a main shaft 24 rotatably supported by the pedestal 15. The spring 20 is held by a spring holder 25 of the pedestal 15. A spring contact portion 26 is fixed to the main shaft 24, and the spring 20 is disposed between the spring holder 25 and the spring contact portion 26. The spring 20 pushes the spring contact portion 26, thereby generating a torque that rotates the crank 11 about the main shaft 24. The stopper contact portion 22 described above is fixed to the main shaft 24. The rotation of the crank 11 provided by the spring 20 is stopped by the stopper 40.

The pedestal 15 is fixed to the rotary stage 18 by position adjustment screws 30. Elongated holes 31, extending in the radial direction of the holding stage 1, are formed in the pedestal 15. The position adjustment screws 30 extend through the elongated holes 31, respectively, and are screwed into screw holes 33 formed in the rotary stage 18. As shown in FIG. 4, the pedestal 15 has, on its lower surface, a guide protrusion 36 extending in the radial direction of the holding stage 1. A guide groove 37, extending in the radial direction of the holding stage 1, is formed in the upper surface of the rotary stage 18. The guide protrusion 36 is slidably located in the guide groove 37. In one embodiment, the pedestal 15 may have a guide groove 37 in its lower surface, and the rotary stage 18 may have a guide protrusion 36 on its upper surface. Specifically, one of the pedestal 15 and the rotary stage 18 has the guide protrusion 36, the other of the pedestal 15 and the rotary stage 18 has the guide groove 37 in which the guide protrusion 36 is fitted, and the guide protrusion 36 is in engagement with the guide groove 37.

Both the guide protrusion 36 and the guide groove 37 extend in the radial direction of the holding stage 1. Therefore, the engagement of the guide protrusion 36 and the guide groove 37 allows the pedestal 15 to move in the radial direction of the holding stage 1, while it does not allow the pedestal 15 to move in the circumferential direction of the holding stage 1. When the position adjustment screws 30 are loosened, the pedestal 15, the crank 11, the workpiece supporting portion 16, the positioning pin 10, the spring 20, the main shaft 24, the spring holder 25, the spring contact portion 26, and the stopper contact portion 22 can be moved together in the radial direction of the holding stage 1. When the position adjustment screws 30 are tightened, the positions of the pedestal 15, the crank 11, the workpiece supporting portion 16, the positioning pin 10, the spring 20, the main shaft 24, the spring holder 25, the spring contact portion 26, and the stopper contact portion 22 are fixed relative to the rotary stage 18. In this way, the position of the positioning pin 10 in the radial direction of the holding stage 1 can be adjusted by the position adjustment screws 30.

In order for the center of the wafer W to substantially coincides with the reference point O (see FIGS. 1 and 2) of the holding stage 1 when the six positioning pins 10 push the outermost edge of the wafer W, these six positioning pins 10 need to be located at a substantially equal distance from the reference point O of the holding stage 1. However, one or more positioning pins 10 may not be in the correct position due to variations in component assembly accuracy or the like. Thus, a tool set, which will be described next, is used to check the positions of the positioning pins 10.

Figure 5:
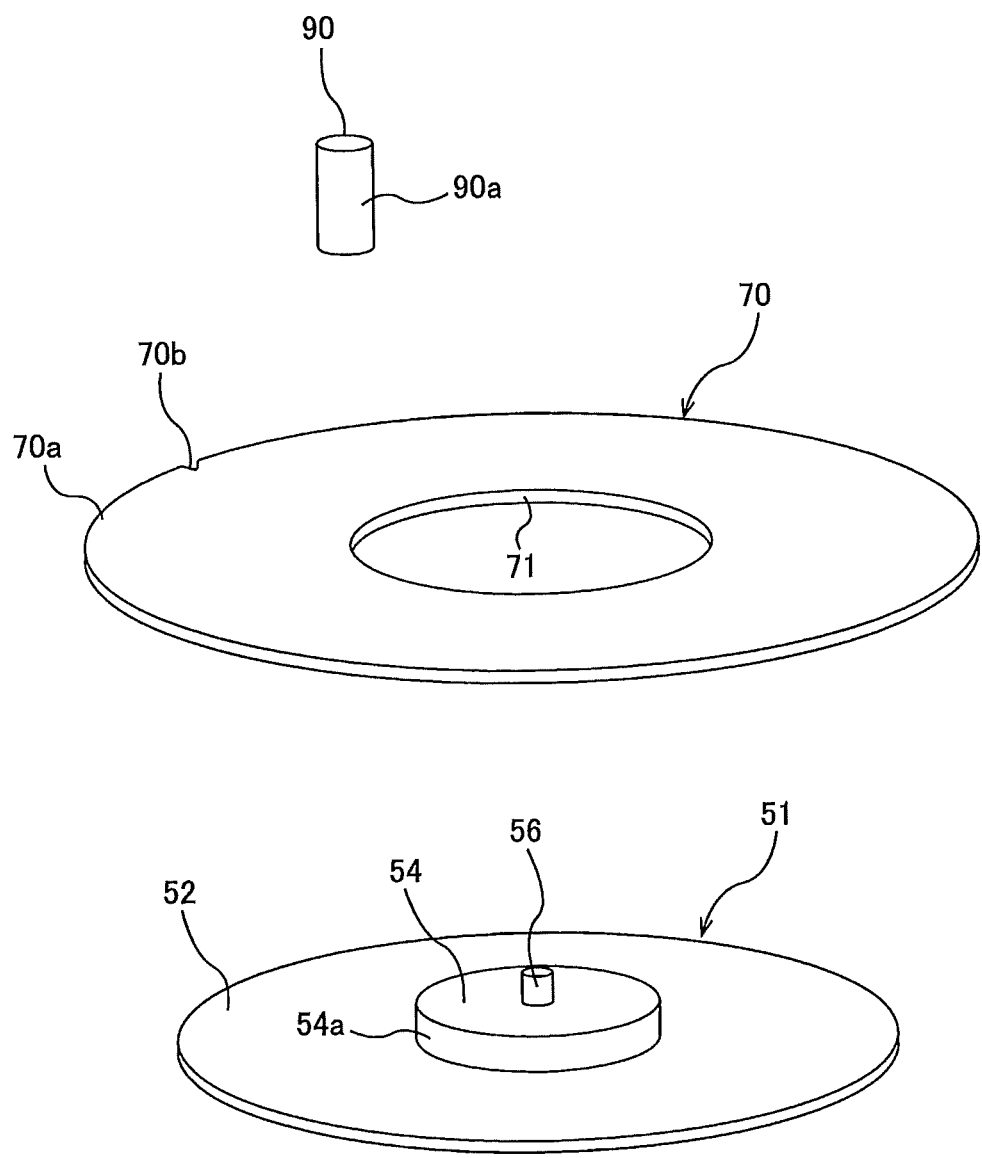
FIG. 5 is a perspective view showing a tool set used to check positions of the positioning pins.

FIG. 5 is a perspective view showing a tool set used for checking the positions of the positioning pins 10. The tool set includes a reference tool 51 to be placed on the holding stage 1, a dummy workpiece 70 to be placed on the reference tool 51, and an check pin 90 having a cylindrical circumferential surface 90a. The reference tool 51 may have the same size as the stage surface 1a of the holding stage 1, or may be smaller than the stage surface 1a. More specifically, the reference tool 51 is smaller than the wafer W which is an example of a workpiece, and is large enough to cover the entirety of the vacuum suction groove 3 (see FIGS. 1 and 2) formed in the stage surface 1a.

The reference tool 51 includes a base plate 52 and a central protrusion 54 protruding from the center of an upper surface of the base plate 52. In the present embodiment, the base plate 52 has a disk shape. The base plate 52 is provided for the purpose of covering the vacuum suction groove 3 (see FIGS. 1 and 2) formed in the stage surface 1a. The base plate 52 has a size smaller than the diameter of the stage surface 1a, and is capable of covering the vacuum suction groove 3 (see FIGS. 1 and 2). The central protrusion 54 has a cylindrical circumferential surface 54a. The central protrusion 54 is located at the center of the base plate 52, i.e., at the center of the reference tool 51. The reference tool 51 further has a cylinder 56 protruding from the center of the central protrusion 54. The cylinder 56 is coupled to the upper surface of the central protrusion 54. The cylinder 56 and the central protrusion 54 are concentric. The base plate 52, the central protrusion 54, and the cylinder 56 are integrally formed. The reference tool 51 is made of synthetic resin such as polyvinyl chloride, acrylic resin or the like, or metal such as stainless steel.

The dummy workpiece 70 is a dummy of the wafer W, which is an example of a workpiece, and functions as a dummy wafer. The dummy workpiece 70 is placed on the reference tool 51, and positioning (centering) of the dummy workpiece 70 is then performed by the above-described positioning pins 10. The dummy workpiece 70 has an outer edge 70a of the same shape and the same size as those of the wafer W. In the present embodiment, the wafer W has a circular shape, and therefore the dummy workpiece 70 also has a circular shape. The dummy workpiece 70 has a circular through-hole 71 having a diameter larger than the diameter of the circumferential surface 54a of the central protrusion 54 of the reference tool 51. The through-hole 71 is located at the center of the dummy workpiece 70. Specifically, the outer edge 70a of the dummy workpiece 70 and the through-hole 71 are concentric. The dummy workpiece 70 is made of synthetic resin such as polyvinyl chloride, acrylic resin or the like, or metal such as stainless steel.

In a case where a cut, such as a notch or an orientation flat, is formed in the periphery of the wafer W, a cut 70b having the same shape and the same size as the cut of the wafer W may preferably be formed in the outer edge 70a of the dummy workpiece 70. The reason of this is to carry out the positioning (or centering) of the dummy workpiece 70 by the positioning pins 10 under the same conditions as the wafer W. For the same reason, the thickness of the outer edge 70a of the dummy workpiece 70 is preferably the same as the thickness of the wafer W. In order to secure the mechanical strength of the entirety of the dummy workpiece 70, an inner portion of the dummy workpiece 70 may be thicker than the wafer W, while the thickness of the outer edge 70a of the dummy workpiece 70 is the same as the thickness of the wafer W.

Figure 6:
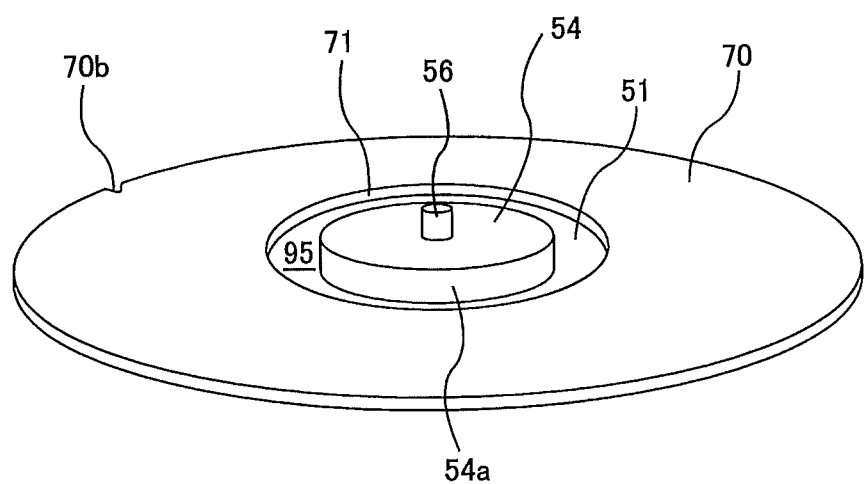
FIG. 6 is a perspective view showing a dummy workpiece placed on a reference tool.
Figure 7:
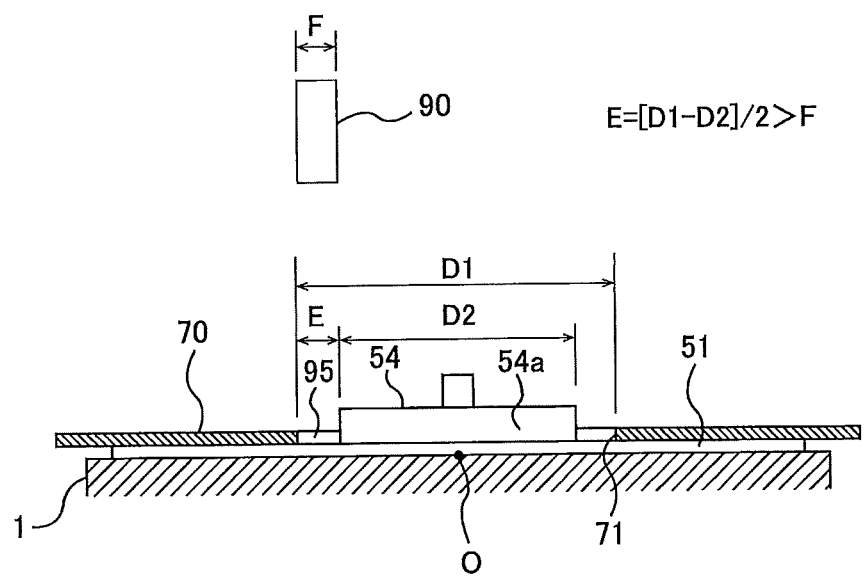
FIG. 7 is a side view of the reference tool and the dummy workpiece shown in FIG. 6.

FIG. 6 is a perspective view showing the dummy workpiece 70 placed on the reference tool 51, and FIG. 7 is a side view of the reference tool 51 and the dummy workpiece 70 shown in FIG. 6. When the dummy workpiece 70 is placed on the reference tool 51 such that the central protrusion 54 of the reference tool 51 is located in the through-hole 71 of the dummy workpiece 70, an annular groove 95 is formed between the circumferential surface of the central protrusion 54 and the through-hole 71. A diameter F of the check pin 90 is smaller than a preset value by a predetermined positioning accuracy. The preset value is a value obtained by dividing a difference between a diameter D1 of the through-hole 71 and a diameter of the circumferential surface D2 of the central protrusion 54 by 2. Therefore, when the center of the dummy workpiece 70 is within the predetermined positioning accuracy with respect to the center of the central protrusion 54, the check pin 90 can be inserted into the annular groove 95 at all positions in the annular groove 95. On the other hand, when the center of the dummy workpiece 70 is out of the predetermined positioning accuracy with respect to the center of the central protrusion 54, there is a place where the check pin 90 cannot be inserted into the annular groove 95. In this manner, an operator can check whether the center of the dummy workpiece 70 is within the predetermined positioning accuracy with respect to the center of the central protrusion 54 by using the check pin 90.

The diameter F of the check pin 90 is determined based on the positioning accuracy of the wafer W that is required for the positioning pins 10. For example, the positioning accuracy of the wafer W required for the positioning pins 10 is ±0.1 mm relative to the reference point O of the holding stage 1. For example, when the difference between the diameter D1 of the through-hole 71 and the diameter of the circumferential surface D2 of the central protrusion 54 is divided by 2 and as a result, 8 mm is determined, the diameter F of the check pin 90 is determined to be 7.9 mm. The check pin 90 is made of a metal, such as stainless steel.

Figure 8:
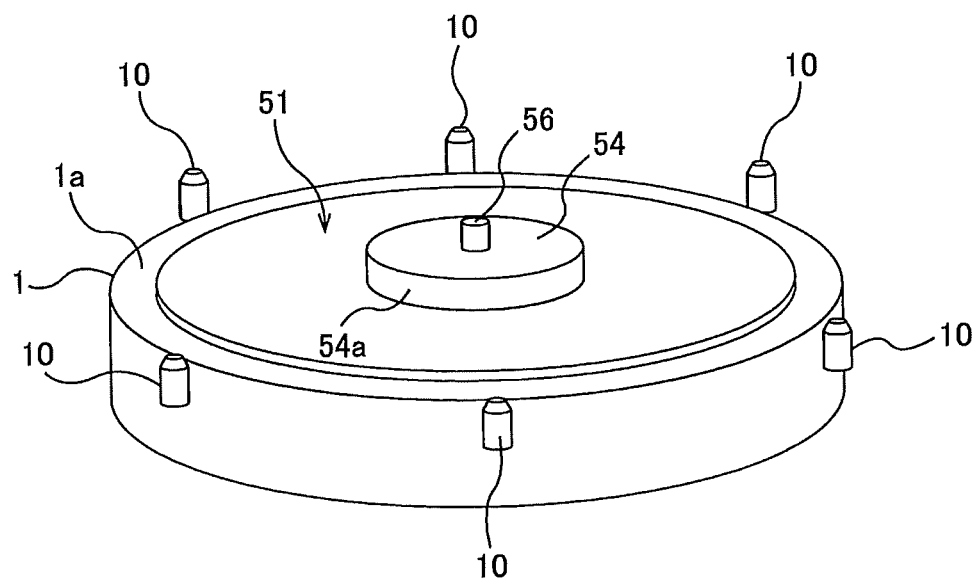
FIG. 8 is a view showing the reference tool placed on a stage surface of the holding stage.
Figure 9:
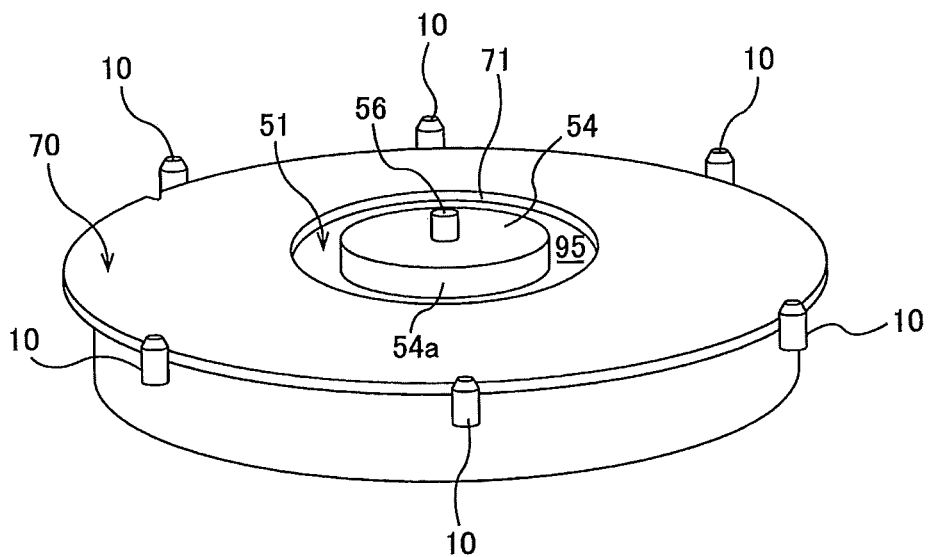
FIG. 9 is a view showing the dummy workpiece placed on the reference tool.
Figure 10:
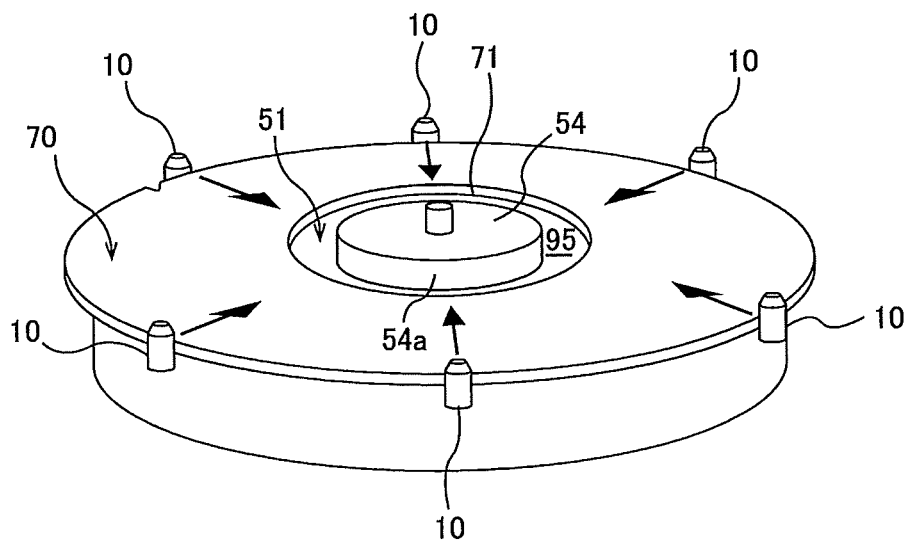
FIG. 10 is a view showing the positioning pins when positioning the dummy workpiece.

Next, a method of using the tool set described above will be described with reference to the drawings. First, as shown in FIG. 8, the reference tool 51 is placed on the stage surface 1a of the holding stage 1 such that the center of the central protrusion 54 coincides with the reference point O (see FIGS. 1 and 2) of the holding stage 1. In this state, a vacuum is formed in the vacuum suction groove 3 (see FIG. 1) of the holding stage 1, whereby the reference tool 51 is held on the holding stage 1. Next, as shown in FIG. 9, the dummy workpiece 70 is placed on the reference tool 51 such that the central protrusion 54 of the reference tool 51 is located in the through-hole 71 of the dummy workpiece 70. The dummy workpiece 70 is movable on the reference tool 51. As shown in FIG. 10, the positioning pins 10 push the outermost edge of the dummy workpiece 70 toward the reference point O of the holding stage 1, thereby positioning of the dummy workpiece 70 is performed.

Figure 11:
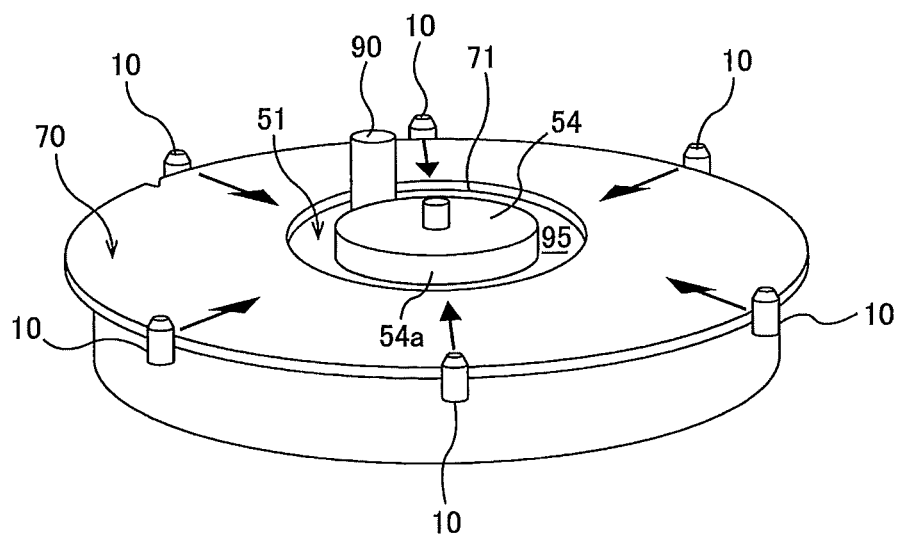
FIG. 11 is a view for explaining a process of inserting a check pin into an annular groove formed between a central protrusion and a through-hole.
Figure 12:
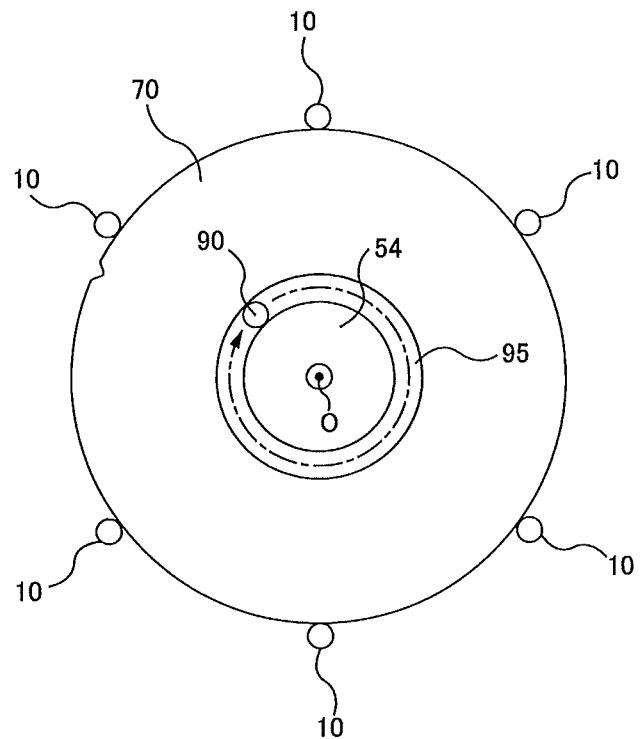
FIG. 12 is a diagram showing the annular groove when the center of the dummy workpiece is within a predetermined positioning accuracy with respect to the center of the holding stage.

As shown in FIG. 11, while the positioning pins 10 push the outermost edge of the dummy workpiece 70, an operator inserts the check pin 90 into the annular groove 95 formed between the central protrusion 54 and the through-hole 71. As shown in FIG. 12, if the check pin 90 can move through the entirety of the annular groove 95, it is judged that the center of the dummy workpiece 70 is within the predetermined positioning accuracy with respect to the reference point O of the holding stage 1. In other words, it can be determined that all the positioning pins 10 are disposed at the correct positions.

Figure 13:
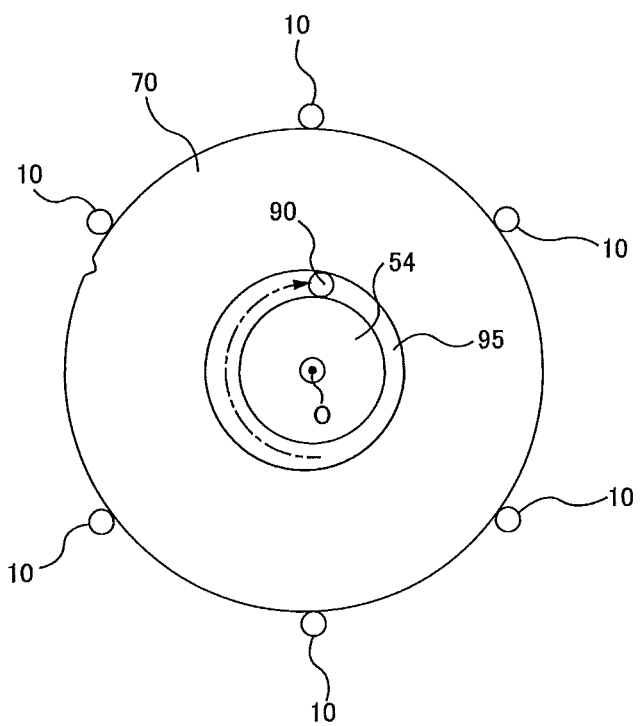
FIG. 13 is a diagram showing the annular groove when the center of the dummy workpiece is out of the predetermined positioning accuracy with respect to the center of the holding stage.

On the other hand, as shown in FIG. 13, if the check pin 90 cannot move through the entirety of the annular groove 95, it is judged that the center of the dummy workpiece 70 is out of the positioning accuracy with respect to the reference point O of the holding stage 1, i.e., at least one of the positioning pins 10 is not disposed at the correct position. In the example shown in FIG. 13, the check pin 90 cannot be inserted at the right side of the annular groove 95. Therefore, it can be judged that the dummy workpiece 70 is shifted to the left relative to the reference point O. Therefore, it is necessary to move the positioning pins 10, pushing the right side of the dummy workpiece 70, outwardly, or move the positioning pins 10, pushing the left side of the dummy workpiece 70, inwardly. Specifically, the position adjustment screws 30 (see FIGS. 3 and 4), fixing these positions of the positioning pins 10, are loosened, and the positioning pins 10 are moved outwardly or inwardly in the radial direction of the holding stage 1. Then, the position adjustment screws 30 are tightened.

In this manner, according to the present embodiment, the operator can easily check whether the positioning pins 10 are located at the correct positions with use of the reference tool 51, the dummy workpiece 70, and the check pin 90. When the positioning pins 10 are not correctly located, the positioning pins 10 to be adjusted and their adjustment direction (radially inward or outward direction) can be specified.

Figure 14:
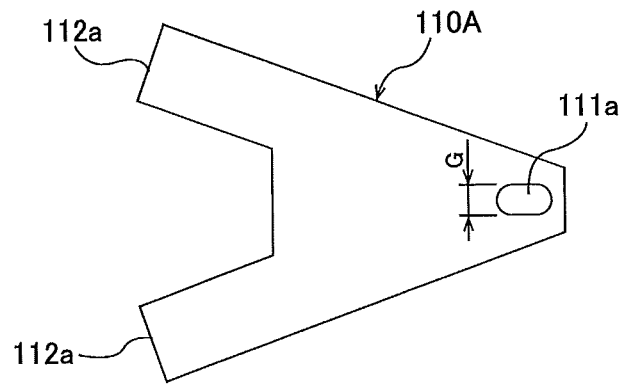
FIG. 14 is a top view showing a first positioning tool.
Figure 15:
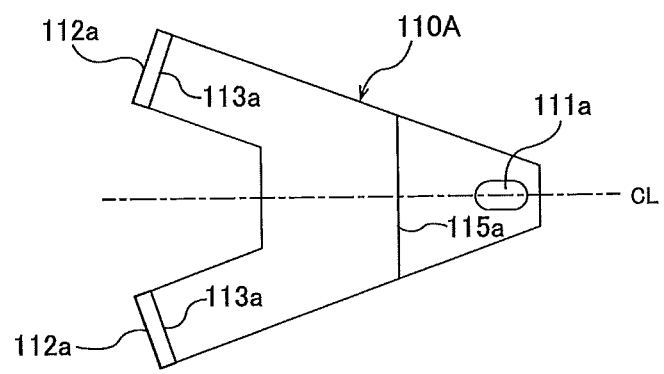
FIG. 15 is a bottom view of the first positioning tool shown in FIG. 14.
Figure 16:
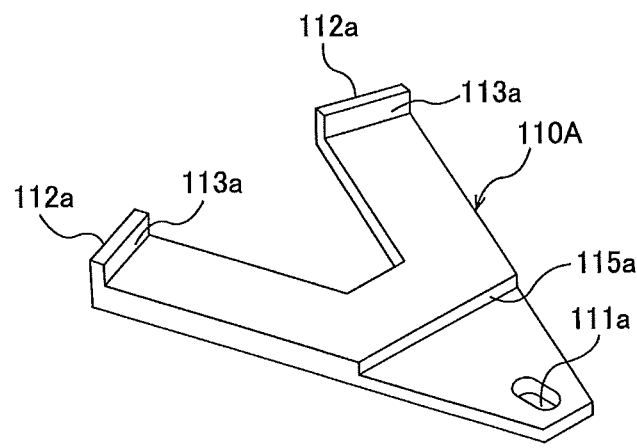
FIG. 16 is a perspective view of the first positioning tool shown in FIG. 15.

In the above-described step shown in FIG. 8, the reference tool 51 is placed at the reference point O on the stage surface 1a of the holding stage 1. More specifically, the reference tool 51 is placed on the holding stage 1 such that the center of the central protrusion 54 coincides with the reference point O of the holding stage 1. FIG. 14 is a top view showing a first positioning tool 110A which is one of a pair of positioning tools used for aligning the center of the reference tool 51 with the reference point O of the holding stage 1, FIG. 15 is a bottom view of the first positioning tool 110A shown in FIG. 14, and FIG. 16 is a perspective view of the first positioning tool 110A shown in FIG. 15.

The first positioning tool 110A has an elongated hole 111a and two hooks 112a. The elongated hole 111a has a width G in a direction perpendicular to a longitudinal direction of the elongated hole 111a. This width G is the same as the diameter F of the cylinder 56 of the reference tool 51. The two hooks 112a are symmetrical with respect to a center line CL passing through the center of the elongated hole 111a and extending in the longitudinal direction of the elongated hole 111a. Each hook 112a has an inner surface 113a facing the elongated hole 111a. The inner surfaces 113a of the two hooks 112a are perpendicular to a lower surface of the first positioning tool 110A and are inclined with respect to each other. In the present embodiment, the inner surfaces 113a are flat surfaces, while the inner surfaces 113a may be curved surfaces as long as the two inner surfaces 113a are symmetrical with respect to the center line CL. A perpendicular bisector of a line segment, connecting two contact points at which the inner surfaces 113a of the hooks 112a are in contact with an outer edge of the holding stage 1, coincide with the center line (CL) extending in the longitudinal direction of the elongated hole 111a. The reference point O of the holding stage 1 exists on the center line CL and within a range of a longitudinal width of the elongated hole 111a (excluding curved portions of the elongated hole 111a). A stepped portion 115a is formed on the lower surface of the first positioning tool 110A. A height of the stepped portion 115a is larger than a height of the central protrusion 54 of the reference tool 51.

Figure 17:
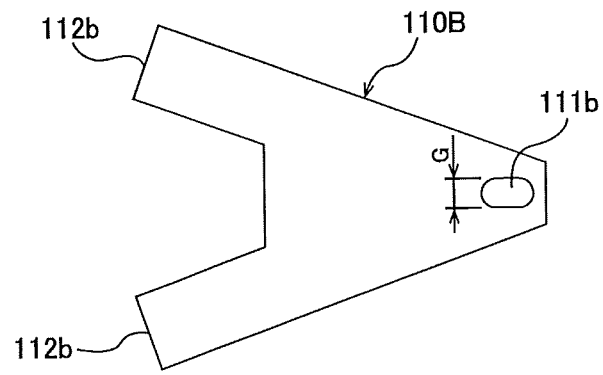
FIG. 17 is a top view showing a second positioning tool.
Figure 18:
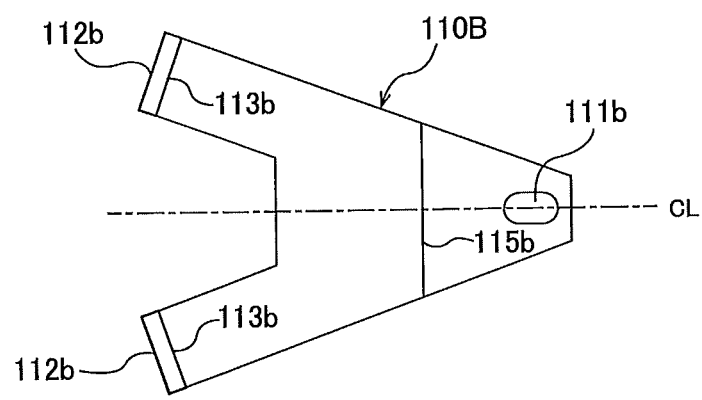
FIG. 18 is a bottom view of the second positioning tool shown in FIG. 17.
Figure 19:
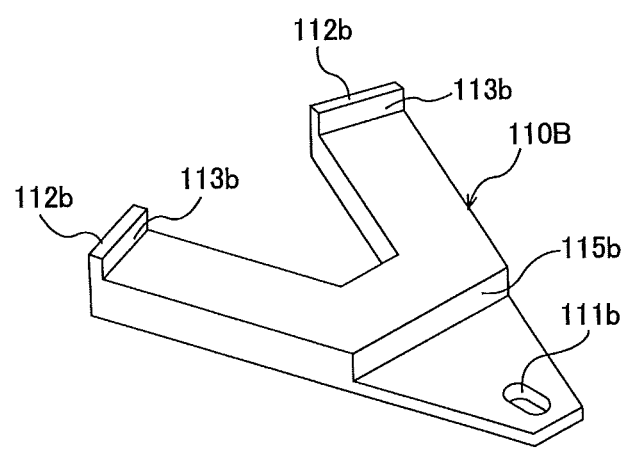
FIG. 19 is a perspective view of the second positioning tool shown in FIG. 18.

FIG. 17 is a top view showing a second positioning tool 110B which is another one of the pair of positioning tools, FIG. 18 is a bottom view of the second positioning tool 110B shown in FIG. 17, and FIG. 19 is a perspective view of the second positioning tool 110B shown in FIG. 18. As shown in FIGS. 17 to 19, the second positioning tool 110B has basically the same shape and the same size as the first positioning tool 110A shown in FIGS. 14 to 16. Specifically, the second positioning tool 110B has an elongated hole 111b and two hooks 112b having inner surfaces 113b. The second positioning tool 110B is different from the first positioning tool 110A in that a height of a stepped portion 115b is larger than the height of the stepped portion 115a of the first positioning tool 110A. The first positioning tool 110A and the second positioning tool 110B are made of a metal, such as stainless steel.

Figure 20:
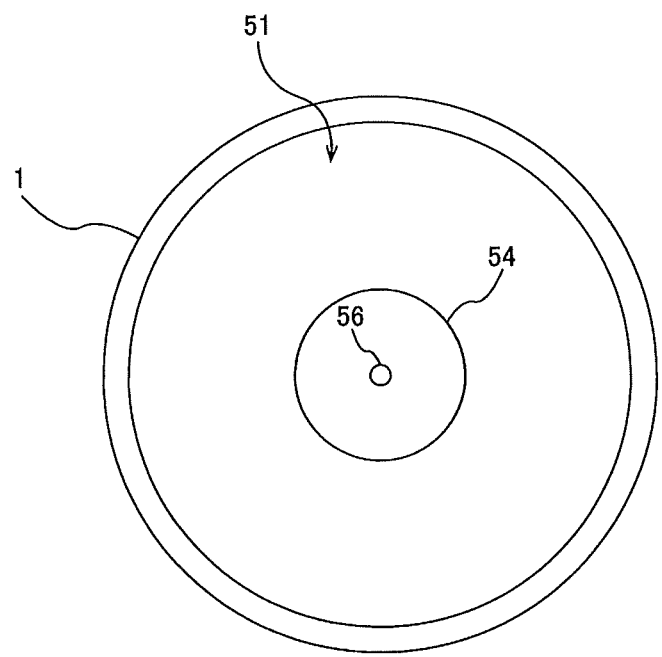
FIG. 20 is a view showing the reference tool placed on the stage surface of the holding stage.
Figure 21:
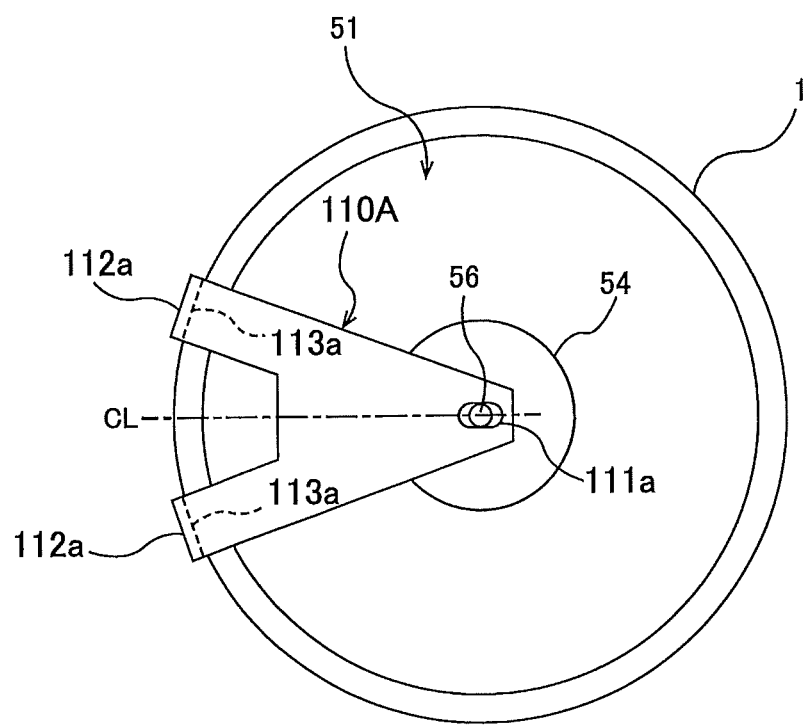
FIG. 21 is a view showing the first positioning tool placed on the reference tool.

The first positioning tool 110A and the second positioning tool 110B are used as follows. As shown in FIG. 20, first, the reference tool 51 is placed on the holding stage 1. At this time, no vacuum is formed in the vacuum suction groove 3 (see FIG. 1), so that the reference tool 51 is movable on the holding stage 1. Next, as shown in FIG. 21, the first positioning tool 110A is placed on the reference tool 51. At this time, the cylinder 56 of the reference tool 51 is inserted into the elongated hole 111a of the first positioning tool 110A, and the inner surfaces 113a of the two hooks 112a of the first positioning tool 110A are brought into contact with the outer edge of the holding stage 1.

Figure 22:
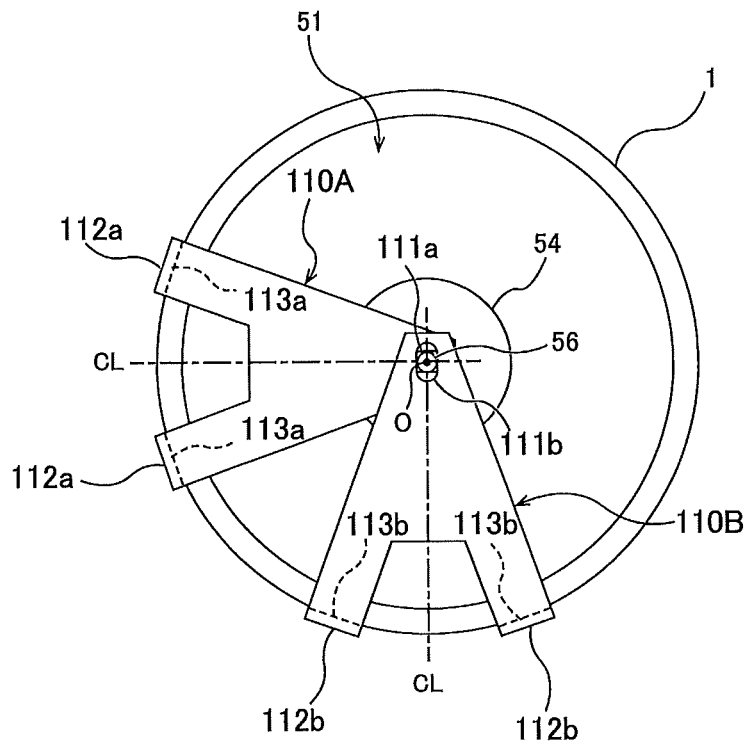
FIG. 22 is a view showing the second positioning tool placed on the reference tool.

Further, as shown in FIG. 22, the second positioning tool 110B is placed on the reference tool 51. As with the first positioning tool 110A, the cylinder 56 of the reference tool 51 is inserted into the elongated hole 111b of the second positioning tool 110B, and the inner surfaces 113b of the two hooks 112b of the second positioning tool 110B are brought into contact with the outer edge of the holding stage 1. It is preferable that the center line CL of the first positioning tool 110A and the center line CL of the second positioning tool 110B be not aligned with each other, and intersect at an angle of about 90 degrees.

An inner portion of the second positioning tool 110B overlaps an inner portion of the first positioning tool 110A. The two elongated holes 111a, 111b of the first positioning tool 110A and the second positioning tool 110B intersect each other when viewed from above. The position of the cylinder 56 of the reference tool 51 is guided by the two elongated holes 111a, 111b. Since the center of the cylinder 56 coincides with the center of the central protrusion 54, the center of the central protrusion 54 coincides with the reference point O of the holding stage 1. While the reference tool 51 is positioned by the first positioning tool 110A and the second positioning tool 110B in this manner, a vacuum is formed in the vacuum suction groove 3 (see FIG. 1), so that and the reference tool 51 is held on the holding stage 1. Thereafter, the first positioning tool 110A and the second positioning tool 110B are removed from the reference tool 51. The longitudinal widths of the elongated holes 111a, 111b can allow the first positioning tool 110A and the second positioning tool 110B to align the center of the reference tool 51 with the reference point O of the holding stage 1 even if the holding stage 1 varies in size.

Figure 23:
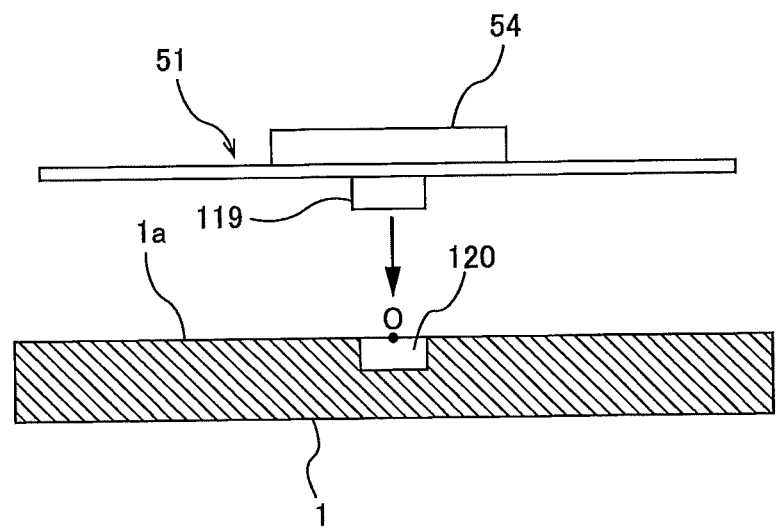
FIG. 23 is a view showing an example of a reference tool having a positioning function.
Figure 24A:
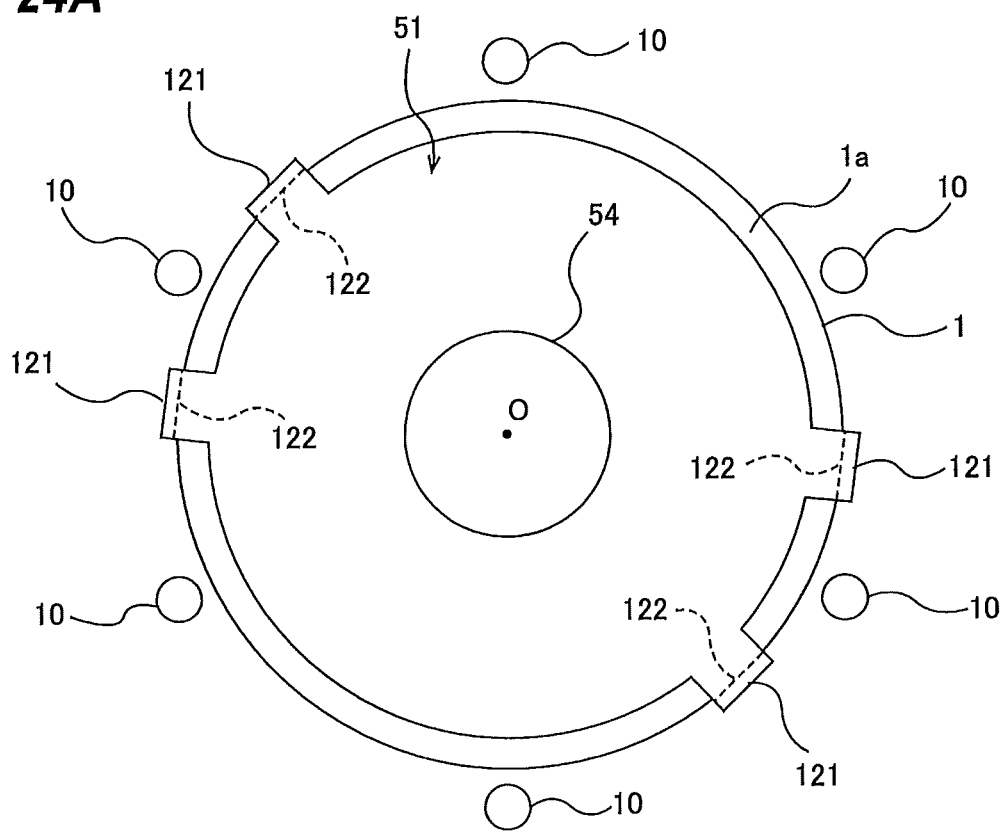
FIG. 24A is a top view showing another example of a reference tool having a positioning function.
Figure 24B:
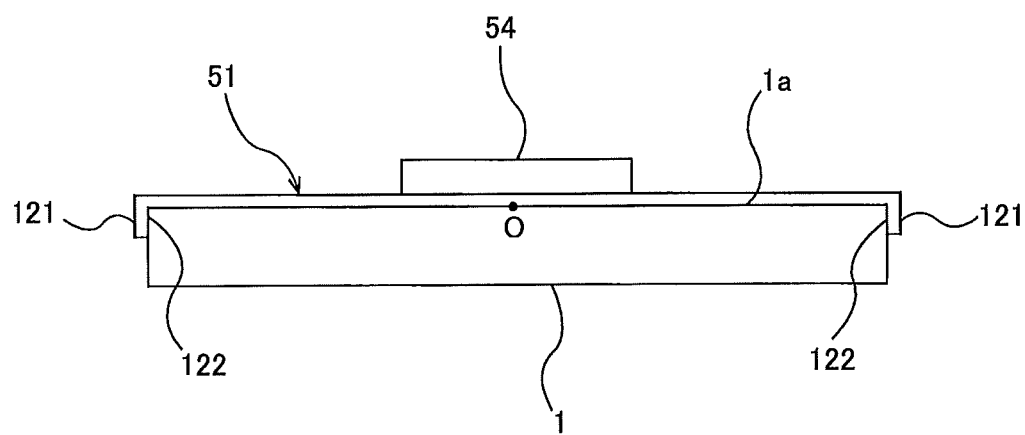
FIG. 24B is a side view of the reference tool shown in FIG. 24A.
Figure 25A:
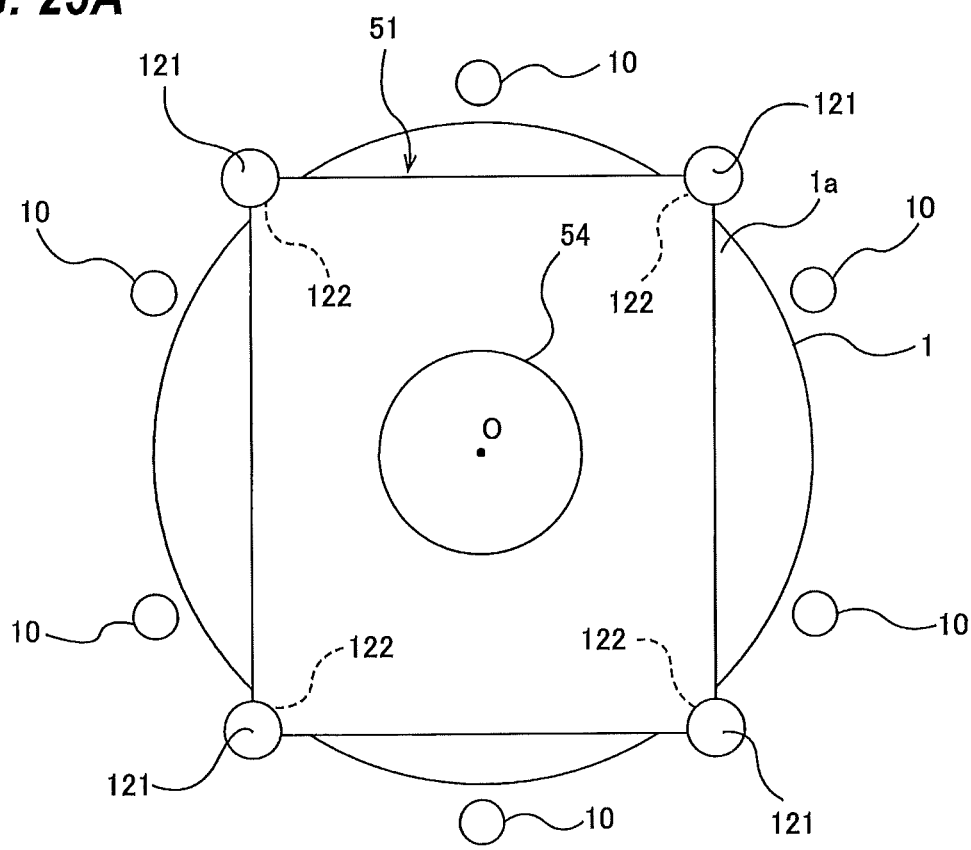
FIG. 25A is a top view showing another example of a reference tool having a positioning function.
Figure 25B:
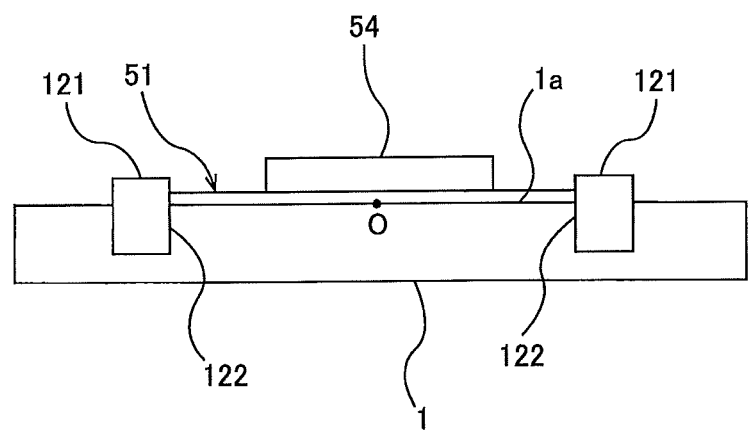
FIG. 25B is a side view of the reference tool shown in FIG. 25A.
Figure 26A:
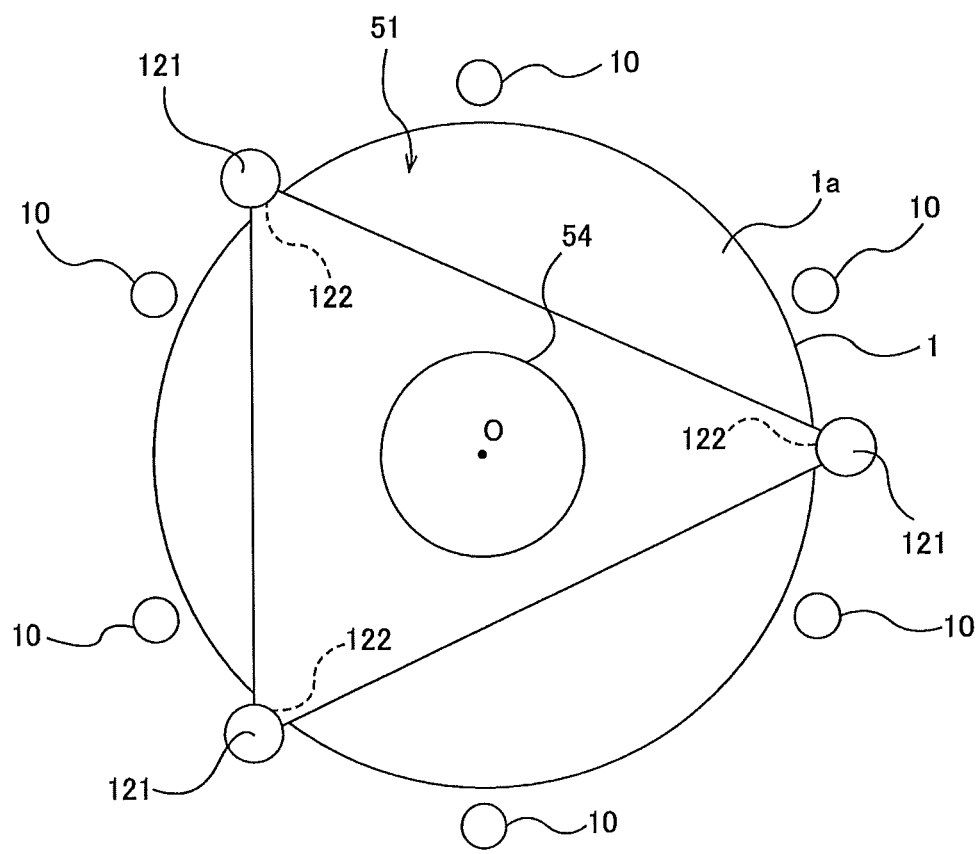
FIG. 26A is a top view showing another example of a reference tool having a positioning function.
Figure 26B:
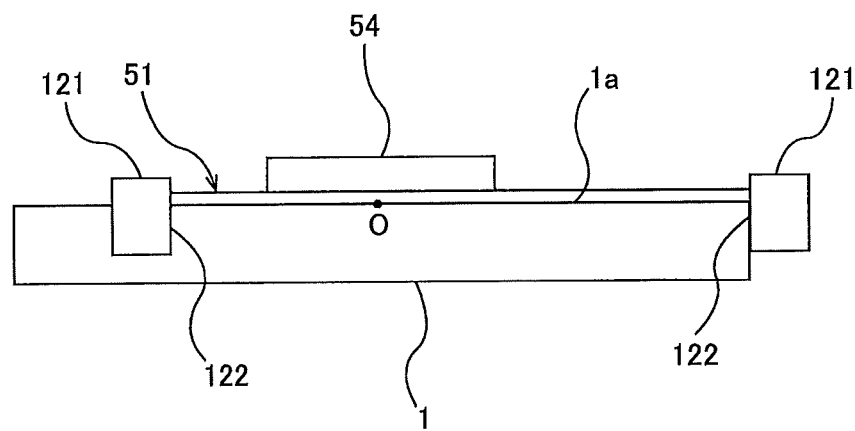
FIG. 26B is a side view of the reference tool shown in FIG. 26A.
Figure 27A:
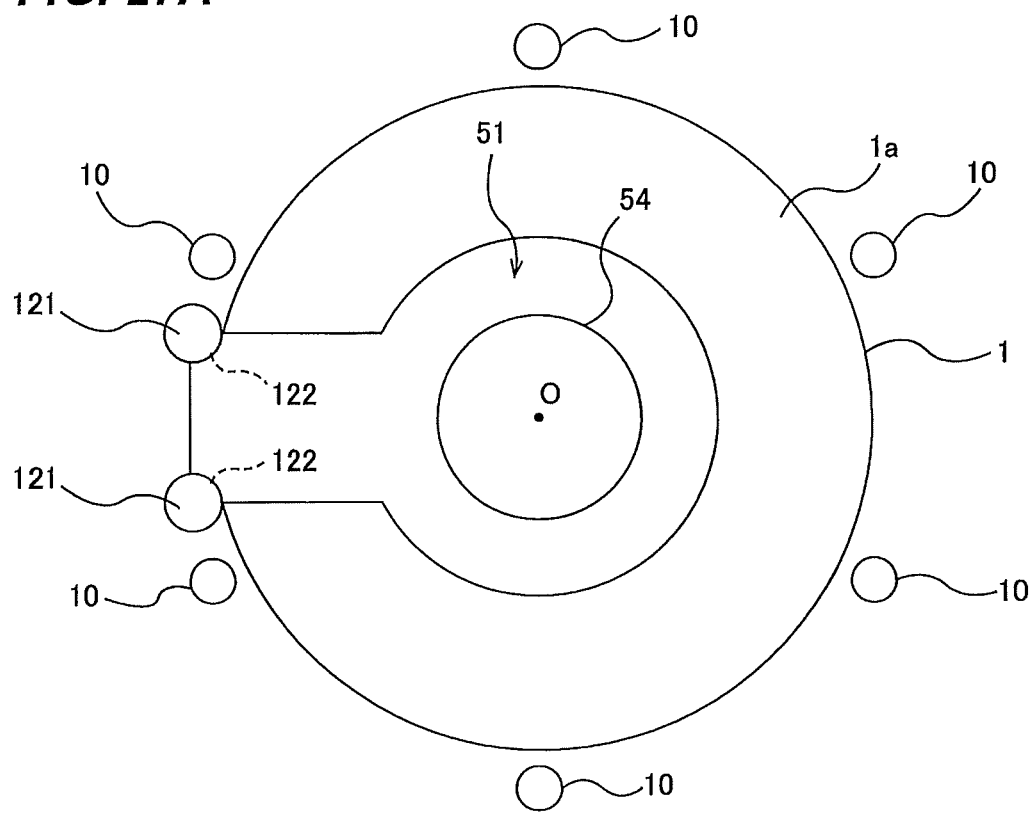
FIG. 27A is a top view showing another example of a reference tool having a positioning function.
Figure 27B:
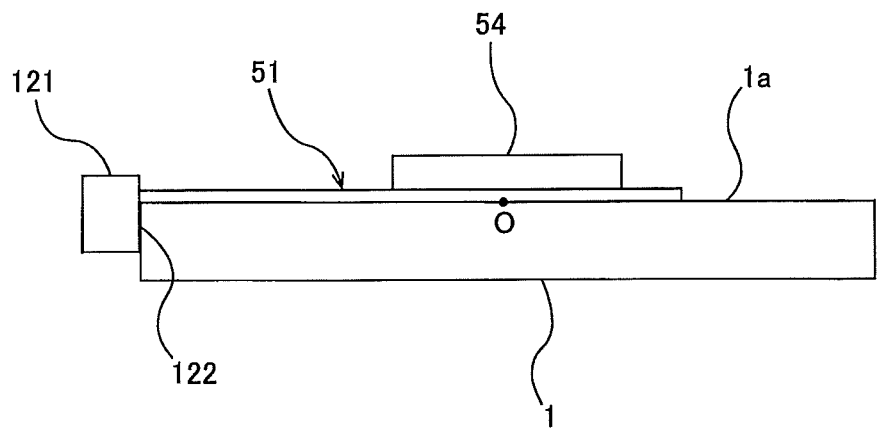
FIG. 27B is a side view of the reference tool shown in FIG. 27A.
Figure 28A:
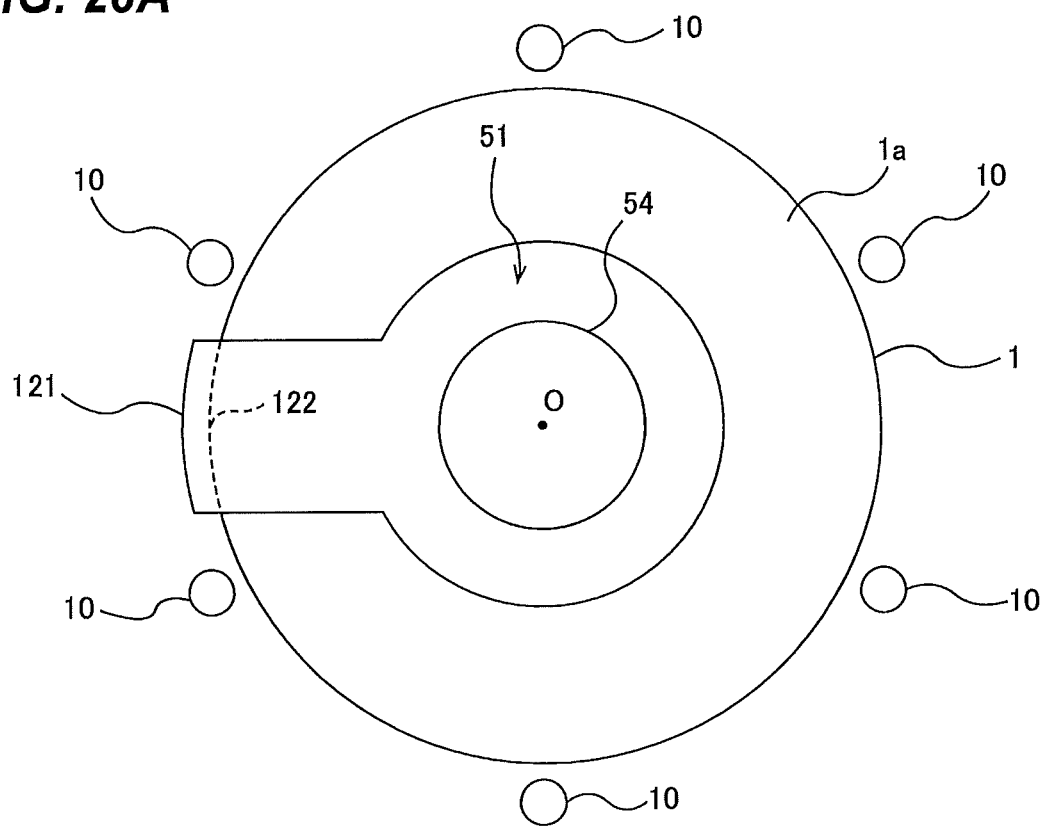
FIG. 28A is a top view showing another example of a reference tool having a positioning function.
Figure 28B:
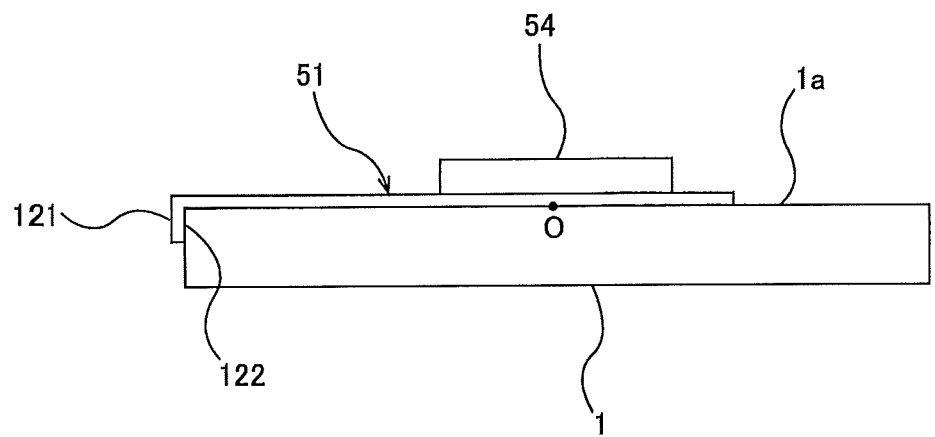
FIG. 28B is a side view of the reference tool shown in FIG. 28A.

In a case where the reference tool 51 has a positioning function, the first positioning tool 110A and the second positioning tool 110B are not necessary. For example, in an embodiment shown in FIG. 23, a projecting portion 119 is formed on the lower surface of the reference tool 51, and a recess 120 is formed in the stage surface 1a of the holding stage 1. The projecting portion 119 can be fitted into the recess 120. The projecting portion 119 is located at the center of the central protrusion 54, and the recess 120 is located at the reference point O of the holding stage 1. When the projecting portion 119 is in engagement with the recess 120, the center of the reference tool 51 coincides with the reference point O of the holding stage 1. In this example, the cylinder 56 of the reference tool 51 is not necessary.

FIGS. 24 to 28 are views showing still other modifications of the reference tool 51. In the examples shown in FIGS. 24 to 28, the reference tool 51 has at least one hook 121 having an inner surface 122 that can come into contact with the outer edge of the holding stage 1. More specifically, the reference tool 51 has four hooks 121 in the examples shown in FIGS. 24 and 25, the reference tool 51 has three hooks 121 in the example shown in FIG. 26, the reference tool 51 has two hooks 121 in the example shown in FIG. 27, and the reference tool 51 has one hook 121 in the example shown in FIG. 28. The hooks (hook) 121 are arranged at positions where the positioning pins 10 do not contact the hooks (hook) 121. The inner surfaces 122 of the hooks 121 may be in point contact, line contact, or surface contact with the outer edge of the holding stage 1. The inner surface 122 of each hook 121 is a plane, a cylindrical surface, or a curved surface extending perpendicularly to the lower surface of the reference tool 51. A distance from a contact point between each inner surface 122 and the outer edge of the holding stage 1 to the center of the central protrusion 54 is equal to a distance from the reference point O of the holding stage 1 to the outer edge of the holding stage 1. Therefore, when the reference tool 51 is placed on the holding stage 1 such that the inner surface 122 of each hook 121 contacts the outer edge of the holding stage 1, the center of the reference tool 51 coincides with the reference point O of the holding stage 1. Also in this example, the cylinder 56 of the reference tool 51 is not necessary.

The above-described tool set is used for adjusting the positions of the positioning pins 10 disposed around the holding stage 1 for holding a circular wafer. It is noted that the above tool set can also be used to adjust positions of positioning pins 10 disposed around a holding stage 1 for holding a workpiece other than the wafer (e.g., rectangular substrate). For example, when the tool set is applied to a rectangular substrate, the shapes of the reference tool 51 and the dummy workpiece 70 are appropriately changed according to the shape of a stage surface 1a of a holding stage 1.

The holding stage 1 and the positioning pins 10 described above are applied to a processing apparatus for locally processing a part of a surface of a workpiece, such as a wafer. For example, the holding stage 1 and the positioning pins 10 can be applied to a partial polishing apparatus for locally polishing a surface of a substrate, such as a wafer, by pressing a polishing tool against a part of the surface of the substrate, a substrate processing apparatus for directing a slurry jet to a part of a surface of a substrate, such as a wafer, to locally remove the surface of the substrate, a substrate cleaning apparatus for locally cleaning a surface of a substrate, such as a wafer, by pressing a cleaning tool against a part of the surface of the substrate. Furthermore, the aforementioned tool set can be used for adjusting the positions of the positioning pins 10 of these various apparatuses.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A tool set for use in adjusting positions of positioning pins arranged around a holding stage for holding a workpiece, comprising:
    a reference tool to be placed on the holding stage;
    a dummy workpiece to be placed on the reference tool; and
    a check pin having a cylindrical circumferential surface, wherein the reference tool has a central protrusion having a cylindrical circumferential surface,
    the dummy workpiece has a circular through-hole having a diameter larger than a diameter of the circumferential surface of the central protrusion,
    an outer edge of the dummy workpiece and the through-hole are concentric, and
    a diameter of the check pin is smaller than a value determined by dividing a difference between the diameter of the circular through-hole and the diameter of the circumferential surface of the central protrusion by 2.

2. The tool set according to claim 1, wherein the outer edge of the dummy workpiece has the same thickness as the workpiece.

3. The tool set according to claim 1, further comprising a pair of positioning tools configured to cause a center of the central protrusion to coincide with a reference point of the holding stage.

4. The tool set according to claim 3, wherein:
    the reference tool further includes a cylinder protruding from the center of the central protrusion;
    each of the positioning tools comprises an elongated hole and two hooks, the elongated hole having the same width as a diameter of the cylinder, the two hooks having inner surfaces facing the elongated hole; and
    the two hooks are symmetric with respect to a center line passing through a center of the elongated hole and extending in a longitudinal direction of the elongated hole.

5. A method of checking positions of positioning pins arranged around a holding stage with use of the tool set according to claim 1, the method comprising:
    holding the reference tool on the holding stage, with a center of the reference tool coinciding with a reference point of the holding stage;
    placing the dummy workpiece on the reference tool such that the central protrusion of the reference tool is located in the through-hole of the dummy workpiece;
    pushing an outer edge of the dummy workpiece inwardly by the positioning pins; and
    inserting the check pin into an annular groove formed between the circumferential surface of the central protrusion and the through-hole.

* * * * *